(12) United States Patent
Schultz et al.

(10) Patent No.: US 7,391,610 B2
(45) Date of Patent: Jun. 24, 2008

(54) THERMAL COOLING OF INDUSTRIAL ELECTRONIC MODULE BY CONDUCTIVE STRUCTURE

(75) Inventors: Ronald E. Schultz, Solon, OH (US); Kenwood H. Hall, Hudson, OH (US); Patrick C. Herbert, Mentor, OH (US); Douglas R. Bodmann, Shaker Heights, OH (US); Daniel E. Killian, Eastlake, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 42 days.

(21) Appl. No.: 11/536,751

(22) Filed: Sep. 29, 2006

(65) Prior Publication Data
US 2008/0080134 A1  Apr. 3, 2008

(51) Int. Cl.
*H05K 7/20* (2006.01)
(52) U.S. Cl. .................. 361/688; 361/704; 361/715; 361/716; 361/719; 165/80.3
(58) Field of Classification Search .......... None
See application file for complete search history.

(56) References Cited

U.S. PATENT DOCUMENTS

| | | | |
|---|---|---|---|
| 4,858,069 A * | 8/1989 | Hughes | 361/696 |
| 5,482,109 A | 1/1996 | Kunkel | |
| 5,513,071 A * | 4/1996 | LaViolette et al. | 361/703 |
| 6,477,053 B1 * | 11/2002 | Zeidan et al. | 361/719 |
| 6,538,884 B1 * | 3/2003 | Wong et al. | 361/688 |
| 6,943,293 B1 | 9/2005 | Jeter et al. | |
| 6,970,358 B2 | 11/2005 | Harris | |
| 6,980,433 B2 | 12/2005 | Fink | |
| 6,980,435 B2 | 12/2005 | Shum et al. | |
| 7,038,910 B1 * | 5/2006 | Hodge et al. | 361/690 |
| 7,082,778 B2 | 8/2006 | Patel et al. | |
| 7,099,153 B2 * | 8/2006 | Yazawa | 361/692 |
| 7,149,086 B2 | 12/2006 | Faneuf et al. | |
| 7,251,133 B2 * | 7/2007 | Wallace | 361/690 |
| 2006/0120039 A1 * | 6/2006 | Yuval | 361/694 |
| 2006/0238980 A1 * | 10/2006 | Bhattacharyya et al. | 361/700 |
| 2006/0268511 A1 * | 11/2006 | Jeong | 361/690 |

FOREIGN PATENT DOCUMENTS

WO   WO 00/41449   7/2000

OTHER PUBLICATIONS

Laird Technologies' literature *titled T-gard™ 5000*.
European Search Report for EP 07 11 7367.

* cited by examiner

*Primary Examiner*—Boris Chérvinsky
(74) *Attorney, Agent, or Firm*—Fay Sharpe, LLP; R. Scott Speroff

(57) ABSTRACT

An electronic module and chassis/module installation are disclosed. The installation comprises a chassis including a metallic heat input region. An electronic module including an electronic component is adapted to be connected to the chassis. An uninterrupted thermal pathway thermally connects the electronic component of the module to the heat input region of the chassis. The thermal pathway comprises a chimney, a heat channel thermally connected to the chimney, and a heat output block thermally connected to the heat channel. A first electrically insulative non-metallic layer thermally couples the chimney to the electronic component. A second electrically insulative non-metallic layer thermally couples the heat output block to the chassis heat input region.

19 Claims, 7 Drawing Sheets

THERMAL COOLING OF INDUSTRIAL ELECTRONIC MODULE BY CONDUCTIVE STRUCTURE

BACKGROUND

Thermal constraints are critical in industrial systems where customer requirements do not allow for use of fans or other forced air flow for cooling. These constraints are becoming increasingly difficult to satisfy as technology trends are forcing electronic module design in the direction of higher power dissipation and resulting heat output. These technology trends include: (i) replacement of traditional, dedicated-purpose, proprietary ASICs that operate at lower clock speeds with commercially available CPUs that operate and higher clock speeds; (ii) increasingly smaller silicon geometries for CPUs that lead to correspondingly increased leakage currents; and, (iii) increasingly harsh customer environments for installation location of industrial electronic modules, with a desire by customers to increase the allowable ambient temperature specification above 60° C. while silicon packaging techniques for CPUs and the like are forcing a reduction in allowable junction temperatures in which the silicon can operate.

The problem of cooling industrial electronic modules is exacerbated by the fact that industrial electronic system are typically modular, with little or no air flow within or adjacent the modules which limits the effectiveness of traditional heat sinks. Thus, for example, a conventional heat sink, using only convection, located within the module and connected to the CPU is insufficient for cooling. Also, conduction of heat to a cover of each industrial electronic module has been found to be insufficient for cooling due to the lack of air flow around the modules and the desire not to increase the spacing between modules.

As noted above, use of fans or other forced air cooling systems is not satisfactory. In some cases, customer requirements simply do not allow for use of fans. Furthermore, use of fans is undesirable due to reliability problems with the fans and the tendency of fans to draw dust and other contaminants into the electronic module. Other cooling systems such as radiant systems, closed-loop phase change systems, and the like are known, but are space and cost prohibitive and present concerns when used as part of an electrical systems.

SUMMARY

In accordance with a first aspect of the present development, an electronic module installation comprises a metal chassis defining at least one slot adapted for receipt of an electronic module. The chassis includes an exposed metal region of a rear wall that defines a heat input region to the chassis. An electronic module is operatively installed in the slot. The module comprises a cover assembly defining an interior space in which a printed circuit board with electronic components is received. The cover assembly includes a thermal pathway that comprises: (i) a heat channel; (ii) a chimney that includes a base that lies closely adjacent and that is thermally coupled to at least one of the electronic components; and (iii) a projecting tail portion that is spaced from the chimney and at least partially defines a heat output block. The heat output block lies closely adjacent and is thermally coupled the heat input region of the metal chassis. The base of the chimney conducts heat from the thermally coupled electronic component into the heat channel. The heat output block conducts heat from the heat channel to the chassis through said heat input region.

In accordance with another aspect of the present development, an electronic module comprises an electronic component and a thermal pathway for drawing heat from the electronic component and conducting heat to an associated metal chassis that is adapted to releasably receive the module. The thermal pathway comprises a chimney, a heat channel thermally connected to the chimney, and a heat output block thermally connected to the heat channel. An electrically insulative nonmetallic layer thermally couples the chimney to the electronic component.

In accordance with another aspect of the present invention, an electronic module installation comprises a chassis comprising a metallic heat input region. An electronic module is removably connected to the chassis. The electronic module comprises an electronic component. An uninterrupted thermal pathway thermally connects the electronic component to the heat input region of the chassis. The thermal pathway comprises a metallic chimney, a metallic heat channel thermally connected to the chimney, and a metallic heat output block thermally connected to the heat channel. First and second electrically insulative non-metallic layers respectively thermally couple the chimney to the electronic component and the heat output block to the chassis heat input region.

BRIEF DESCRIPTION OF THE DRAWINGS

The present development comprises various components and arrangements of components, and/or various steps and arrangements of steps, preferred embodiments of which are disclosed herein with reference to the accompanying drawings wherein.

DETAILED DESCRIPTION

Figure 1A:
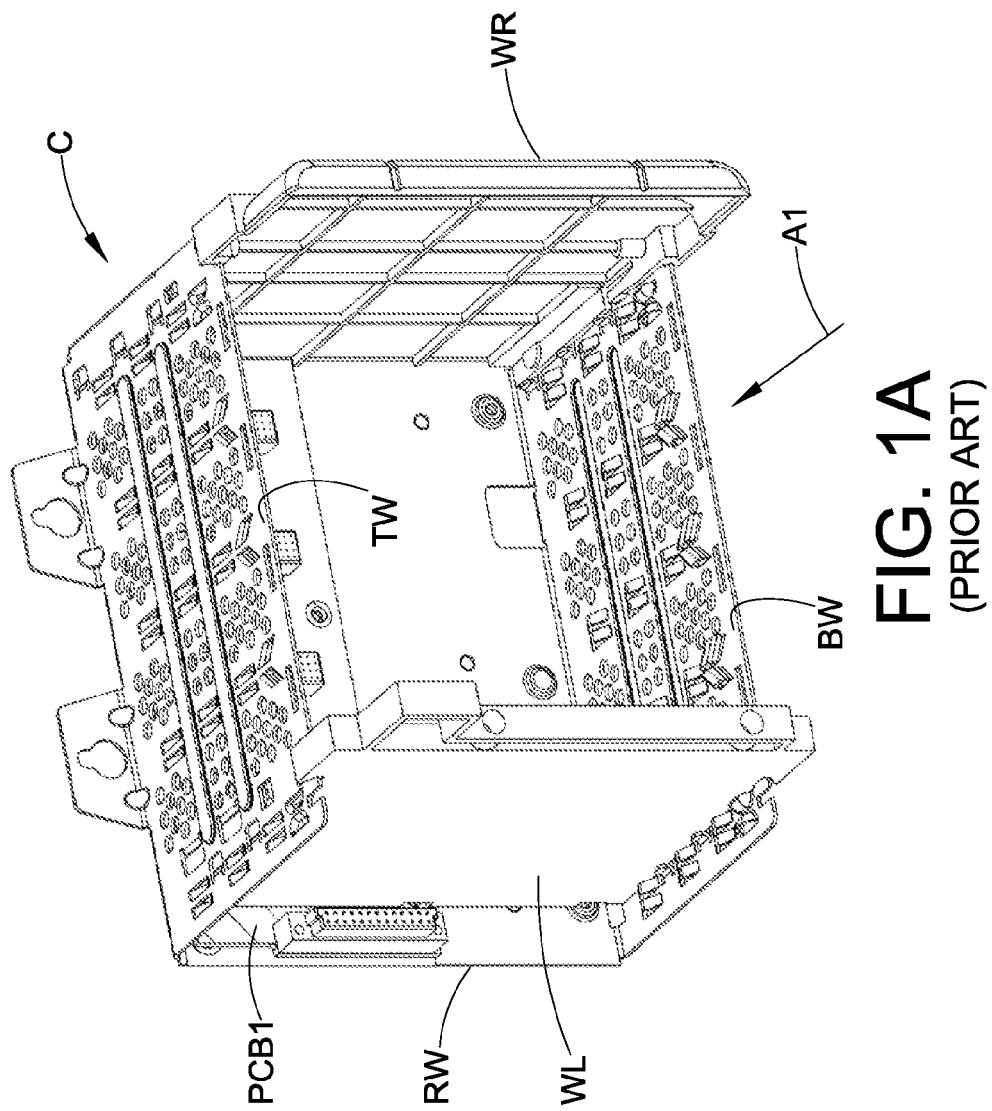
FIGS. 1A and 1B (prior art) are isometric and front elevation views of a conventional metal chassis adapted to receive industrial electronic modules.
Figure 1B:
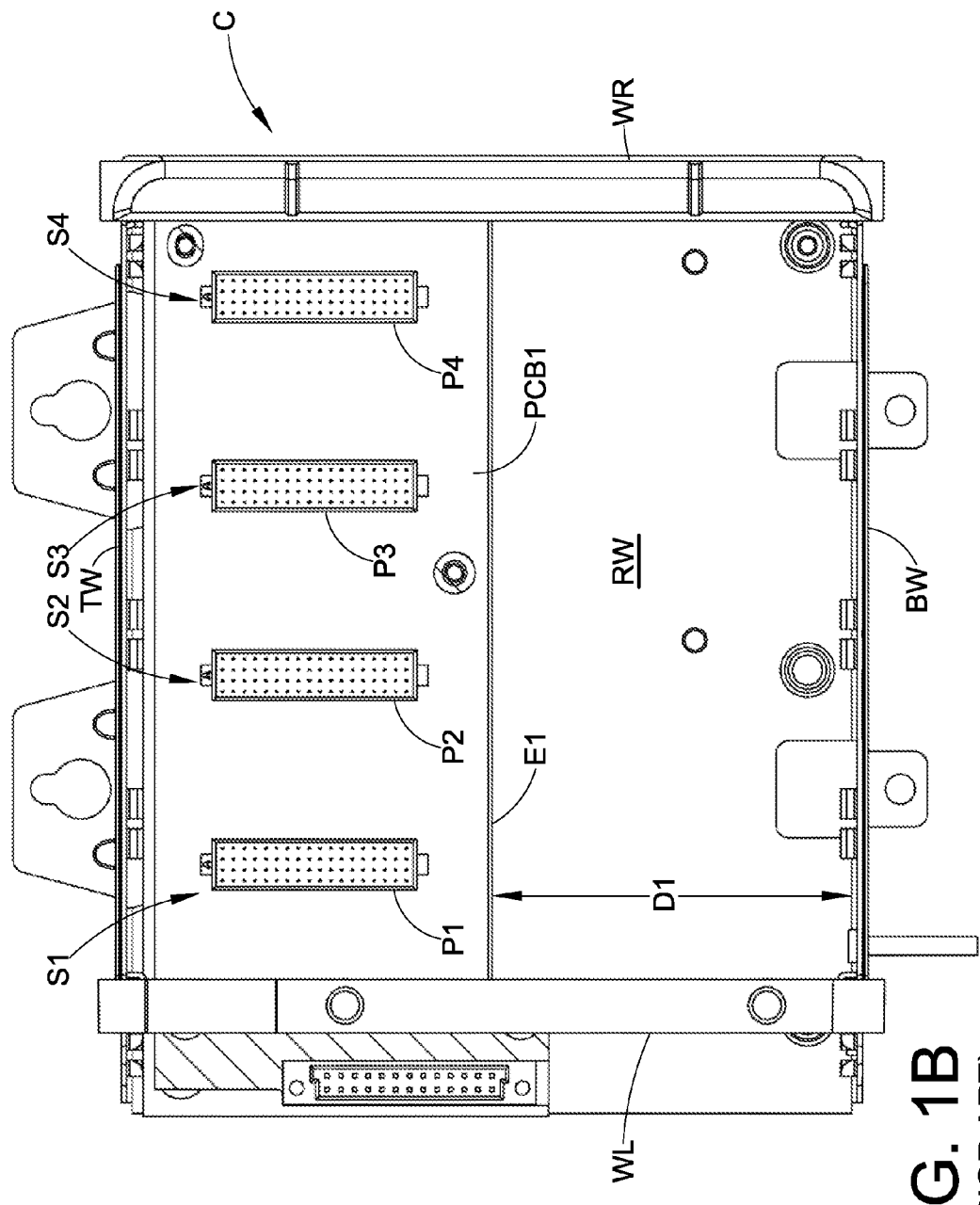

FIGS. 1A and 1B illustrate a conventional metal chassis C adapted to receive conventional industrial electronic modules for a control system or the like. As is generally known in the art, the chassis defines a plurality of slots or module-receiving locations S1, S2, S3, S4 where a module can be inserted by movement toward a rear wall RW of the chassis as indicated by the arrow A1. The top and bottom of the industrial electronic module include clips that engage the top and bottom walls TW, BW of the chassis, and the module includes an electrical plug that mates with a corresponding plug P1, P2, P3, P4 of each slot S1S4, respectively. It should be noted that the plugs P1-P4 are connected to a printed circuit board PCB1 that extends laterally between left and right side walls WL, WR of the chassis. Between a lower edge E1 of the printed circuit board PCB1 and the bottom wall BW of the chassis C, the metal rear wall RW of the chassis is exposed and recessed relative to the circuit board PCB1. Conventional metal or plastic modules inserted into the slots S1-S4 of the chassis C do not include any structure for mating and thermally coupling with the exposed metal region of the chassis rear wall RW to provide a dedicated thermal conduction pathway from the module to the chassis.

Figure 2:
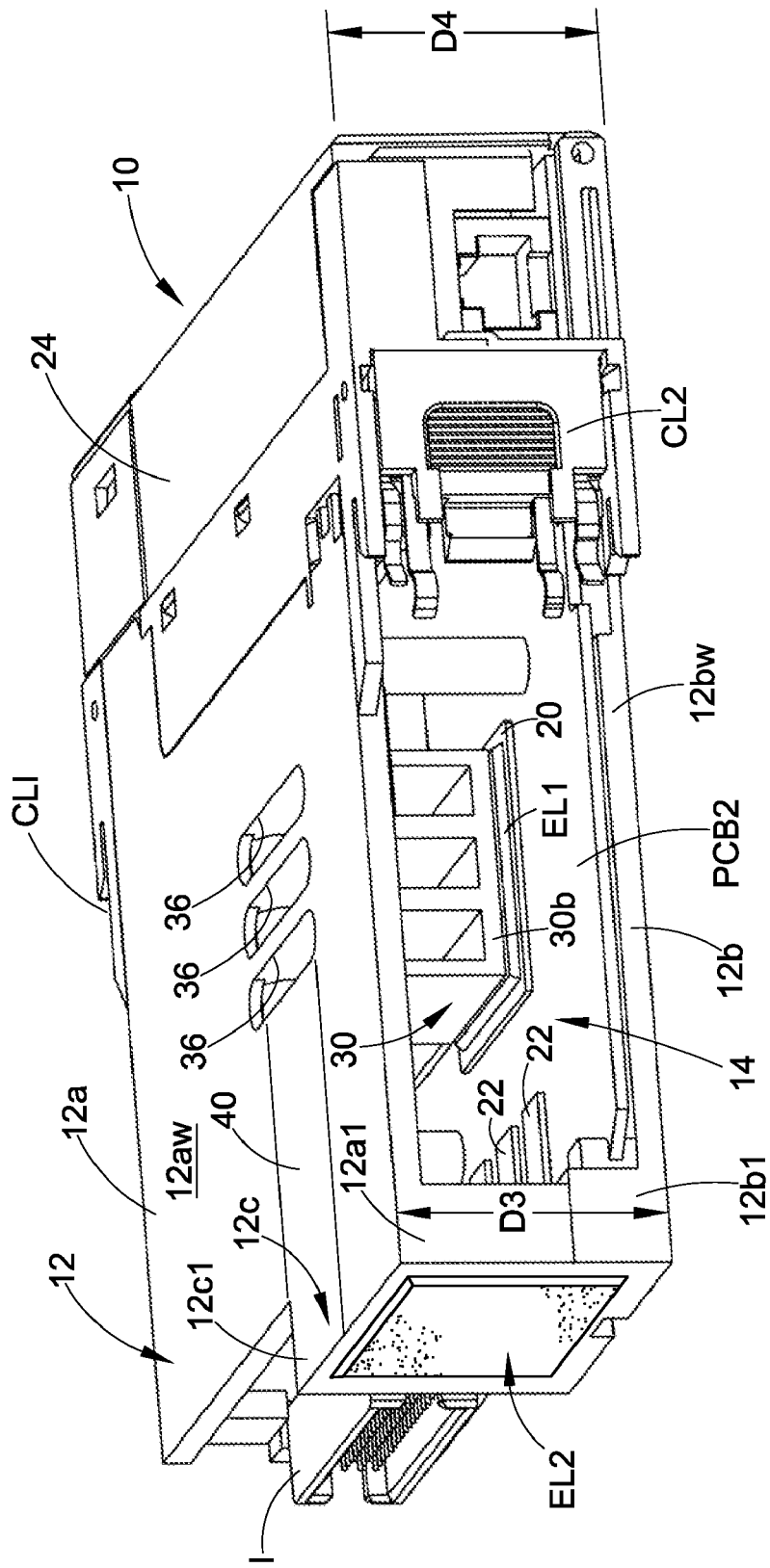
FIG. 2 is a bottom isometric view of an industrial electronic module formed in accordance with the present development.

FIG. 2 shows an industrial electronic module 10 formed in accordance with the present development. The module 10 is adapted to be received into any one of the slots S1-S4 of a conventional mounting chassis C and includes conventional top and bottom clips CL1,CL2 that respectively engage the top and bottom chassis walls TW,BW. Unlike a conventional module, however, the module 10 comprises a thermal pathway that draws heat from the electronic components within the module and that includes a heat output block 12c that intimately mates with the exposed portion of the chassis rear wall RW, which is referred to herein heat input region HI of the chassis C, to conduct heat from the thermal pathway of the module 10 to the chassis C.

More particularly, the module 10 comprises a thermal pathway for conducting heat from an electronic component of the module to the chassis. In the illustrated embodiment, the thermal pathway is provided as part of a cover assembly 12. The cover assembly 12 includes: (i) a heat sink cover portion 12a that both draws and pipes heat; and, (ii) one or more other cover portions such as the base cover portion 12b. The heat sink cover portion 12a and preferably both portions 12a, 12b are defined from and/or comprise a metal such as aluminum or other thermally conductive metal. The cover portions 12a, 12b are interconnected with each other to define the cover assembly to include an interior space 14. A printed circuit board PCB2 is connected to and/or lies adjacent the base cover portion 12b and includes a CPU 20 and a plurality of other heat-generating electronic devices 22 connected thereto and located within the interior space 14. An interface plug I is adapted to mate with one of the chassis plugs P1-P4 when the module 10 is installed in a respective slot S1-S4 of the chassis C, to operatively connect the CPU 20 and other electronic devices 22 to the plug P1-P4 and other electronic components operatively coupled to the plug P1-P4. The CPU 20 and other devices 22 are spaced from but are oriented toward the heat sink cover portion 12a. The cover assembly 12 includes a heat output block 12c that is defined by at least a projecting tail portion 12a1 of the heat sink cover portion 12a. As shown herein, both cover portions 12a,12b are defined from aluminum or another thermally conductive metal, and the cover portions 12a,12b include respective projecting tail portions 12a1,12b1 that abut each other and cooperate to define the heat output block 12c of the cover assembly 12. A conventional face plate 24 is connected to the cover assembly 12 and is operatively connected to the printed circuit board PCB2 for input/output of data such as data required for user status lights/sounds, user input buttons/switches, etc. This face plate 24 comprises a plastic structure that insulates a user from heat of the cover assembly 12.

Figure 3:
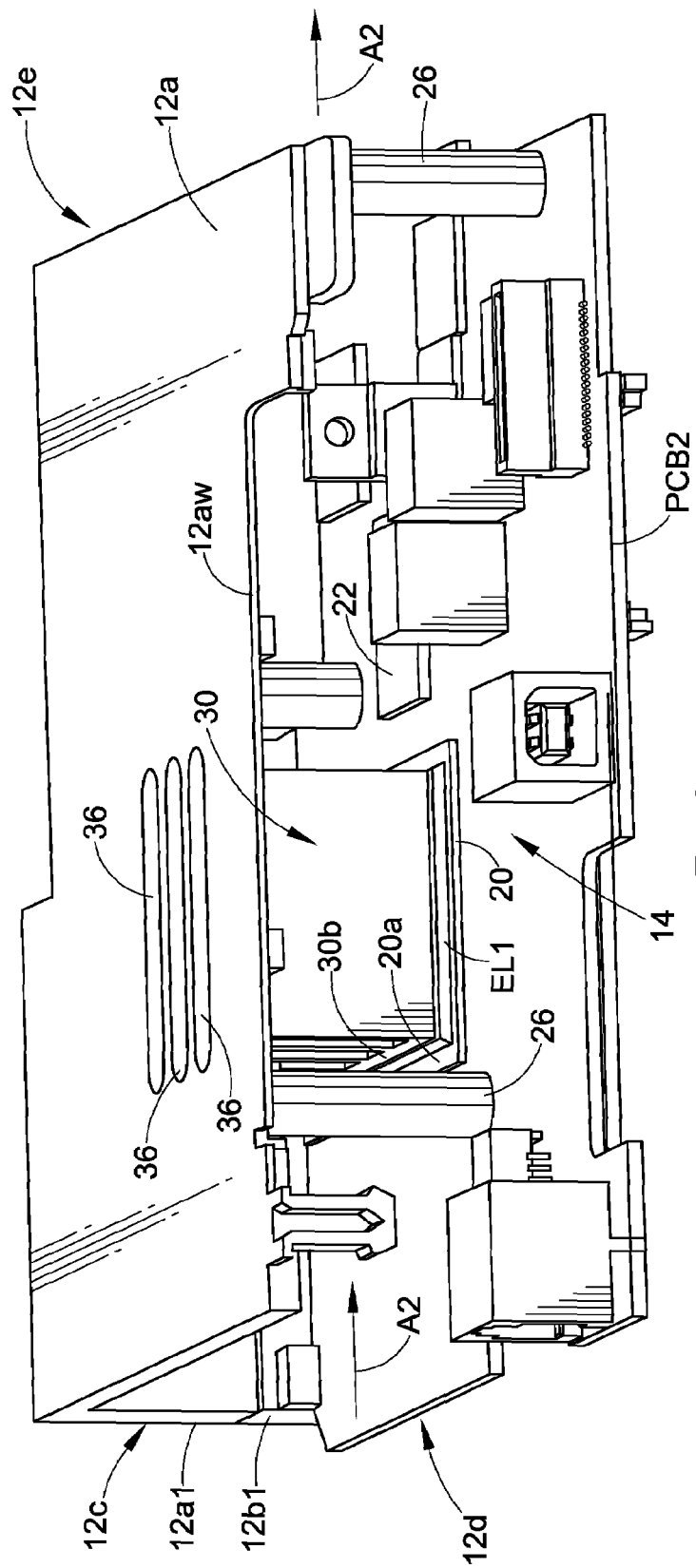
FIG. 3 is a front isometric view of the industrial electronic module of FIG. 2 (a face plate of the module is removed in FIG. 3 to reveal the printed circuit board and its relationship to the cover assembly)

Referring also now to FIG. 3, where the face plate 24 has been removed in a front isometric view of the module 10, the cover assembly 12 is shown from another perspective. The cover portions 12a,12b are interconnected by fasteners (not shown) that extend through the base cover portion 12b into fastener bosses 26 of the heat sink cover portion (see also FIG. 4 where the heat sink cover portion 12a is shown by itself). The printed circuit board PCB2 is connected to the base cover portion 12b by any suitable means and/or can be clamped between the base cover portion 12b and the fastener bosses 26 when the cover portions 12a,12b are interconnected so that it lies adjacent the base cover portion 12b. The cover portions 12a,12b comprise respective outer walls 12aw,12bw that are arranged in parallel spaced-apart relation to each other so that the interior space 14 is defined therebetween. Top and bottom ends 12d,12e of the cover assembly 12 are substantially open to encourage air flow through the into and through the interior space 14 of the cover assembly as is desirable for cooling as indicated by the arrows A2.

The heat sink cover portion 12a is spaced from the printed circuit board PCB2, but includes at least one chimney 30 that projects inwardly from an inner surface of wall 12aw toward the base cover portion 12b, so that a base portion 30b of the chimney lies closely adjacent and is thermally coupled to a corresponding electronic component on the printed circuit board PCB2. As shown in the illustrated embodiment, the heat sink cover portion 12a includes a single chimney 30 having a base 30b that lies closely adjacent and that is thermally coupled to the CPU 20, but the cover portion 12a can alternatively include multiple chimneys that are thermally coupled to respective multiple electronic components 20,22. For good thermal coupling, the base 30b is conformed and dimensioned to closely overlie at least substantially all of an upper surface 20u of the CPU 20. The base 30b can be thermally coupled to the CPU 20 by direct contact but, preferably, a thermally conductive, electrically insulative and mechanically compliant layer EL1 is located between and contacts both the chimney base 30b and an upper surface 20u of the CPU 20 to provide the required thermal coupling and to compensate for any space resulting from mechanical misalignment between the chimney base 30b and upper surface 20u of the CPU 20 which is key to providing a real-world solution. In one embodiment, the layer EL1 is an elastomeric-based layer that comprises a dielectric material including a polyimide film coated with a ceramic filled high temperature silicon rubber available commercially from Laird Technologies (www.lairdtech.com) and is sold under the trademark T-GARD 5000, but it is not intended that the present development be limited to such product. In one embodiment, the elastomeric layer EL1 is adhered to the chimney base 30b and contacts the CPU when the cover assembly 12 is assembled. Those of ordinary skill in the art will recognize that the elastomeric layer EL1 allows for heat transfer from the CPU 20 to the chimney 30 without fear of the chimney causing any electrical interference in the CPU.

Figure 4:
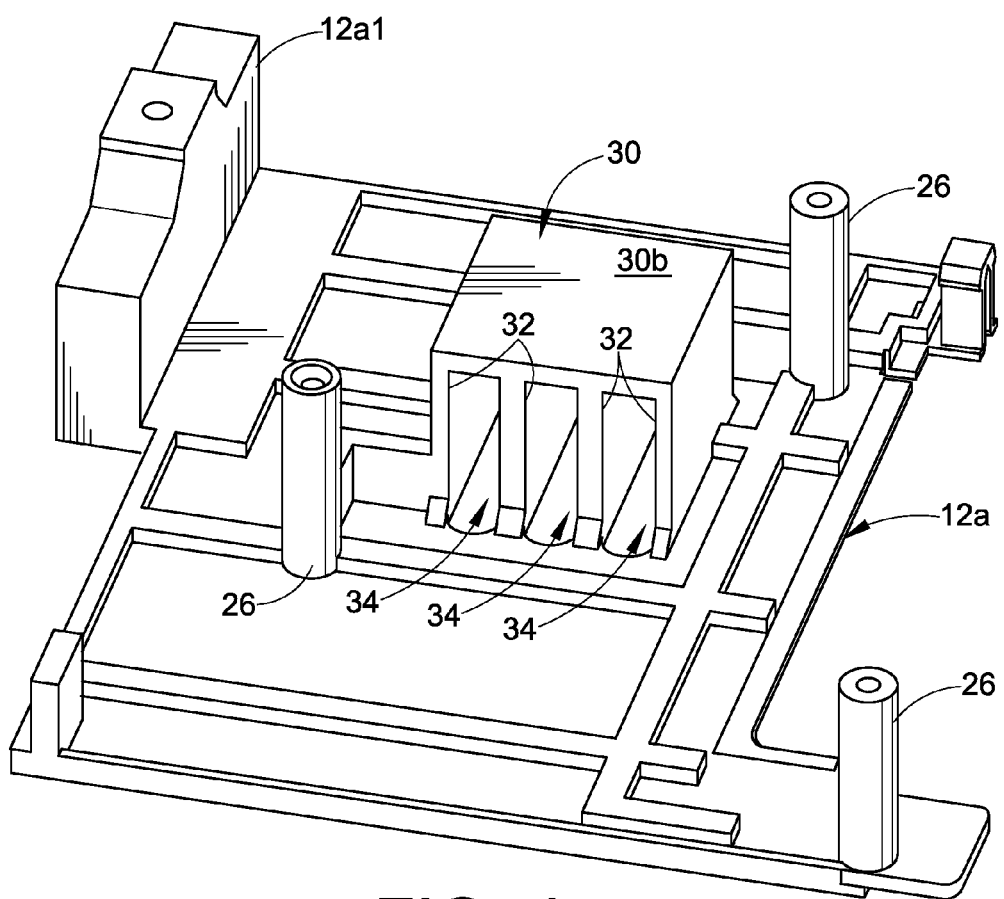
FIG. 4 is an isometric view of the heat sink cover portion of the module of FIG. 2.

Referring to all of FIGS. 2-4, the chimney 30 is preferably defined as a one-piece construction in the heat sink cover portion 12a (shown by itself in FIG. 4), to maximize thermal transfer from the chimney to the other portions of the heat sink cover portion 12a. The chimney 30 can be any desired shape, e.g., a solid block, a plurality of individual projections, etc. Also, the chimney 30 need not be integral to or defined as a one-piece construction with the wall 12aw, and can conduct heat to the cover portion 12a and/or through another metallic thermal conductive path to the chassis C. As shown herein, the chimney comprises a plurality of spaced-apart fins 32 that define air flow channels 34 therebetween. The fins 32 are arranged parallel to each other and are oriented such that the fins and air flow channels extend parallel to a vertical axis X (FIGS. 2,5B) of the module 10 which results in the air flow channels being aligned with the open top and bottom ends 12d,12e of the cover assembly 12 to encourage cooling air flow through the channels 34 between the fins 32. The chimney base 30b is preferably an uninterrupted planar member that connects to and interconnects all of the fins 32. In this manner, heat that enters the base 30b is transferred to each fin 32.

Heat that is conducted into the chimney 30 from the CPU 20 is further conducted through a heat channel 40 (diagrammatically illustrated with broken lines in FIG. 2) of the cover assembly 12 to the heat output block 12c portion of the cover assembly. In the illustrated embodiment, the wall 12aw of the heat sink cover portion 12a, itself, provides the required heat channel 40 to the tail portion 12a1 which, alone or with optional tail portion 12b1, defines the heat output block 12c. The heat sink cover portion 12a further includes slots 36 that open through the wall 12aw into the air flow channels 34, respectively. Depending upon the presence of adjacent modules, the slots 36 can potentially allow for added airflow into or out of the air flow channels 34 for added cooling effect. The slots also facilitate manufacturing of the cover portion 12a and chimney 30 thereof. In an alternative embodiment, the heat channel interconnecting the chimney 30 to the heat output block 12c is provided by a metallic path that is connected to or entirely separate from the wall 12aw of the cover portion, in which case the wall 12aw need not be metallic. As such, it can be seen that the chimney 30, wall 12aw or other heat channel 40, and heat output block 12c define a thermal pathway in accordance with the present development.

Figure 5A:
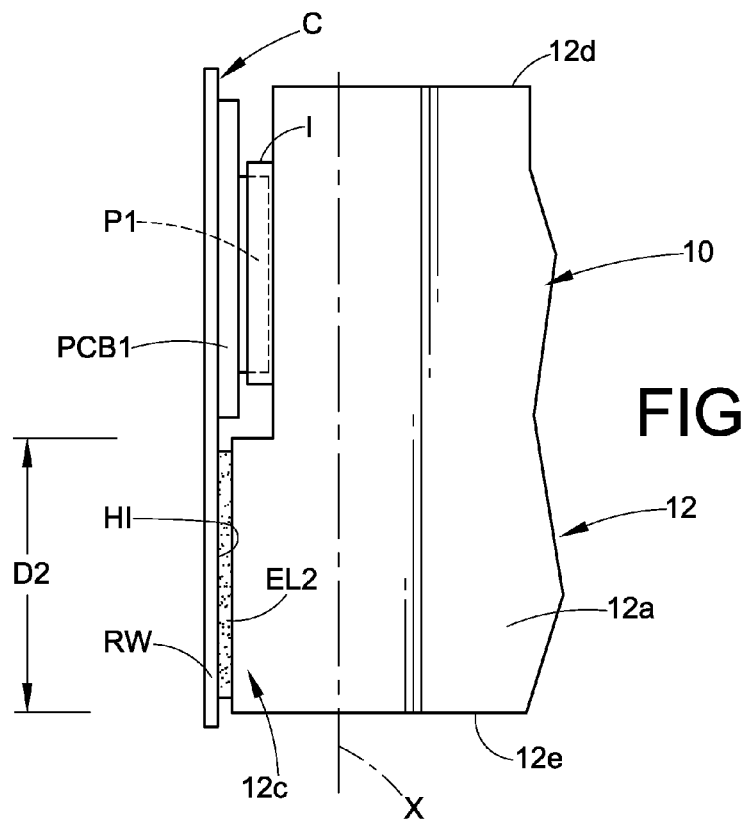
FIG. 5A is a side view that illustrates the module of FIG. 2 mounted in the chassis of FIGS. 1A and 1B (the module is shown only partially and the top and bottom walls of the chassis are not shown to reveal the fit of the module in the chassis)
Figure 5B:
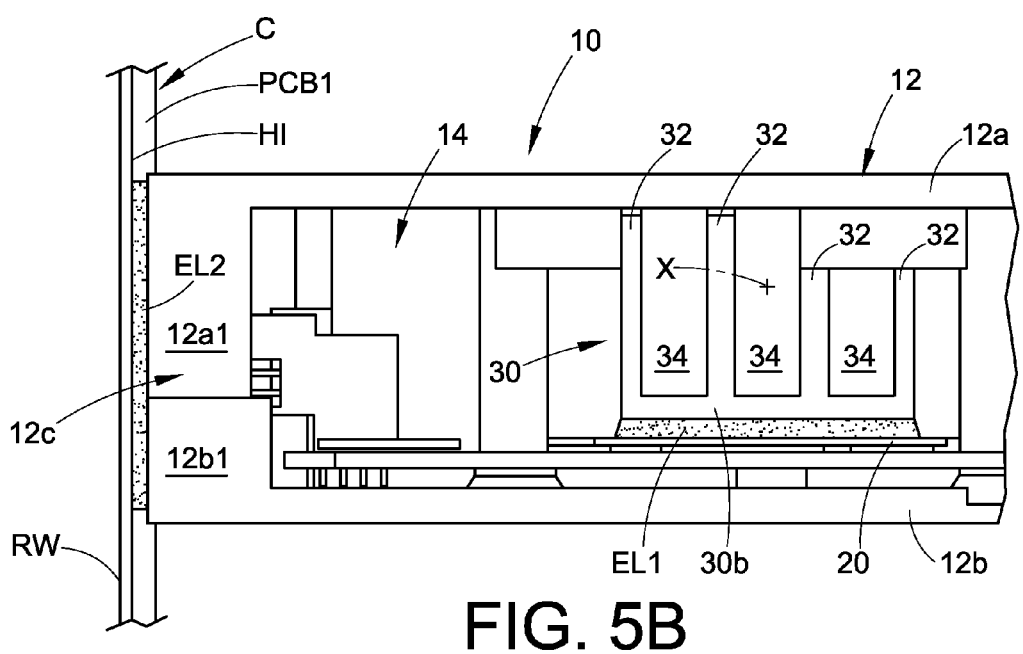
FIG. 5B is a bottom view that illustrates the module of FIG. 2 mounted in the chassis of FIGS. 1A and 1B (the module is shown only partially and the top and bottom walls are not shown to reveal the fit of the module in the chassis)

FIGS. 5A, 5B show that when a module 10 formed in accordance with the present development is installed in a slot of the chassis C, the heat output block 12c lies closely adjacent and is thermally coupled to the metal heat input region HI of the chassis C. The module 10 is shown only partially and portions of the chassis C are not shown in order to reveal the fit of the module 10 in the chassis C, in particular, the intimate fit between the heat output block 12c and the chassis heat input region HI, with the elastomeric layer EL2 ensuring good thermal conduction between these two metal regions. The thermal coupling of the heat output block 12c to the chassis C can alternatively be via direct metal-to-metal contact between the block 12c and region HI but, preferably, the thermally conductive elastomeric layer EL2 is used as an interface. The layer EL2 is preferably the same or a comparable material as the thermally conductive elastomeric layer EL1 described above and is located between and contacts both the heat output block 12c and the chassis heat input region HI. As shown in FIG. 2, in the illustrated embodiment, the elastomeric layer EL2 is adhered to a rear planar face 12c1 of the heat output block 12c so that the elastomeric layer EL2 contacts the heat input region HI of the chassis C when the module 10 is installed in the chassis for the required thermal coupling and to compensate for any space resulting from mechanical misalignment between the heat output block 12c and the chassis heat input region HI which is important to provide a workable real-world solution. As shown in FIG. 1B, the heat input region HI defines a minimum height D1 between the printed circuit board PCB1 and the bottom wall BW, and it is preferred that the heat output block 12c define a maximum height D2 (FIG. 5A) that is at least 90% of the heat input region height D1 to maximize heat transfer to the chassis heat input region HI while not interfering with sliding insertion/installation of the module 10 into the chassis. Typically, to ensure that the heat output block 12c does not interfere with sliding insertion of the module 10 into the chassis C, a lateral dimension D3 (FIG. 2) of the heat output block is equal to or less that a maximum lateral dimension D4 of the module 10, itself, i.e., the heat output block 12c does not project laterally outward beyond the respective walls 12aw, 12bw of the cover portions 12a, 12b. Those of ordinary skill in the art will recognize that the chimney 30 of the heat sink cover 12a is thermally coupled to the chassis C through the heat channel such as the wall 12aw, the heat output block 12c and chassis heat input region HI. This causes heat to be conducted from the CPU 20 out of the module 10 to the chassis C. FIG. 5B, which is a bottom view, also reveals the open bottom end 12e of the cover assembly 12 which allows air flow to the fins 32 of the chimney 30 and through the channels 34 between fins. Furthermore, the thermally conductive layers EL1, EL2 are electrically non-conductive so as to electrically insulate the module 10 from the chassis C which is beneficial in certain cases to define and electrical or logical ground reference.

Figure 6:
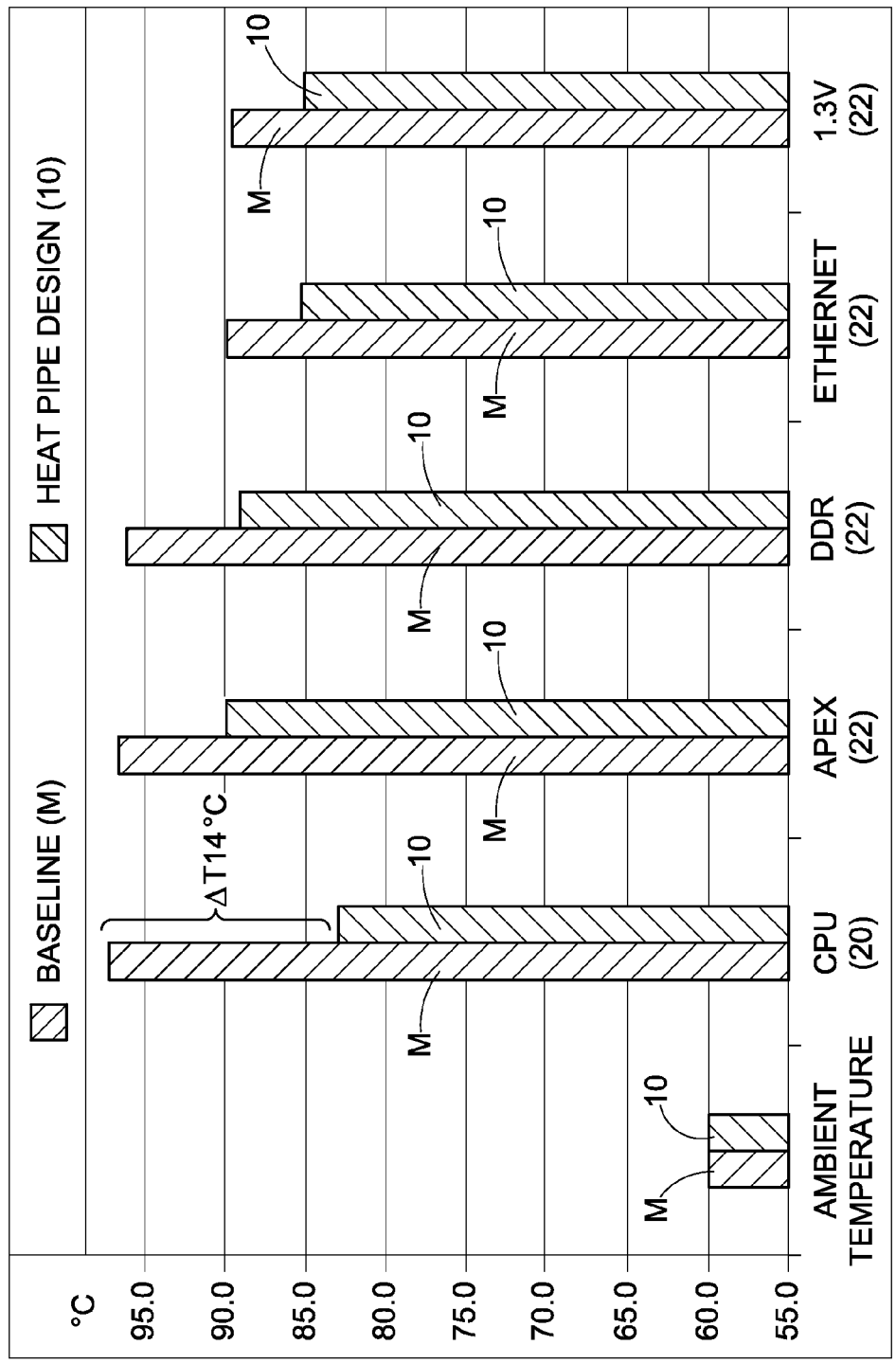
FIG. 6 is a graph of experimental results indicating temperature reduction in a module formed in accordance with the present development as compared to a prior art module.

FIG. 6 is a graph of experimental results indicating temperature reduction in a module formed in accordance with the present development as compared to a prior art module. There, it can be seen that for a prior art (baseline) module M and a module 10 formed according to the present development, the measured temperature of the CPU 20 and other electronic components 22 within the space 14 of the module M, 10 was reduced by an amount $\Delta T$ for a given ambient temperature of 60° C., with $\Delta T=14°$ C. for the CPU 20. It should be noted that the $\Delta T$ values for the components 22 occurred even though only the CPU 20 was thermally coupled to the heat sink cover portion 12a through a chimney structure 30 as described above.

Those of ordinary skill in the art will recognize that the present development provides an electronic module and/or module/chassis installation. The installation comprises a chassis C including a metallic heat input region HI. An electronic module 10 including an electronic component 20 is connected to the chassis C. An uninterrupted thermal pathway thermally connects the electronic component 20 to the heat input region HI of the chassis C. The thermal pathway comprises a metallic chimney 30, a metallic heat channel 40 thermally connected to the chimney 30, and a metallic heat output block 12c thermally connected to the heat channel 40. First and second electrically insulative non-metallic layers EL1, EL2 respectively thermally couple the chimney 30 to the electronic component 20 and the heat output block 12c to the chassis heat input region HI.

The development has been described with reference to preferred embodiments. Those of ordinary skill in the art will recognize that modifications and alterations to the preferred embodiments are possible. The disclosed preferred embodiments are not intended to limit the scope of the following claims, which are to be construed as broadly as possible, whether literally or according to the doctrine of equivalents.

The invention claimed is:

1. An electronic module installation comprising:
 a metal chassis defining at least one slot adapted for receipt of an electronic module, said chassis comprising an exposed metal region of a rear wall that defines a heat input region to the chassis;
 an electronic module operatively installed in said at least one slot, said module comprising a cover assembly defining an interior space in which a printed circuit board with electronic components is received, said cover assembly including a thermal pathway that comprises: (i) a heat channel; (ii) a chimney that includes a base that lies closely adjacent and that is thermally coupled to at least one of said electronic components; and (iii) a projecting tail portion that is spaced from said chimney and at least partially defines a heat output block, wherein said heat output block lies closely adjacent and is thermally coupled said heat input region of said metal chassis, wherein said base of said chimney conducts heat from said thermally coupled electronic component into said heat channel and wherein said heat output block conducts heat from the heat channel to said chassis through said heat input region.

2. The electronic module installation of claim 1, wherein said heat input region of said chassis is defined by said exposed metal region of said rear wall that lies between a lower edge of a chassis printed circuit board located adjacent said rear wall and a bottom wall of said chassis so that said heat input region is recessed relative to said chassis printed circuit board.

3. The electronic module installation of claim 2, wherein said heat input region defines a minimum height between said lower edge of said printed circuit board and said chassis bottom wall, and wherein said heat output block defines a maximum height that is at least 90% of said height input region minimum height.

4. The electronic module installation of claim 1, wherein said heat channel is defined by at least part of an outer wall of a heat sink cover portion of said cover assembly, and wherein said chimney projects from an inner surface of said outer wall, said base of said chimney spaced inwardly from said outer wall of said heat sink cover portion, wherein said chimney comprises a plurality of fins that extend from said outer wall of said heat sink cover portion to said base of said chimney.

5. The electronic module installation of claim 4, wherein said plurality of fins are spaced apart from each other so that at least one air flow channel is defined between two spaced apart fins.

6. The electronic module installation of claim 5, wherein said plurality of fins are parallel to each other and extend parallel to a vertical axis of said electronic module so that said at least one air flow channel extends parallel to said vertical axis, and wherein vertically spaced-apart top and bottom ends of said cover assembly are open to allow vertical air flow to and from said at least one air flow channel.

7. The electronic module installation of claim 4, wherein heat sink cover portion is defined as a one-piece metal construction including said base and fins of said chimney and said outer wall and said projecting tail portion.

8. The electronic module installation of claim 7, wherein said one-piece metal construction comprises an aluminum alloy.

9. The electronic module installation of claim 1, wherein:
said base of said chimney is thermally coupled to said at least one electronic component by a first layer of non-metallic, electrically insulative material located between and in contact with said base of said chimney and said at least one electronic component; and,
said heat output block is thermally coupled to said heat input region of said metal chassis by a second layer of a non-metallic, electrically insulative material located between and in contact with said heat output block and said heat input region.

10. An electronic module comprising:
an electronic component;
a thermal pathway for drawing heat from the electronic component and conducting heat to an associated metal chassis adapted to releasably receive the module, said thermal pathway comprising:
a chimney;
a heat channel thermally connected to the chimney;
a heat output block thermally connected to the heat channel;
an electrically insulative non-metallic layer that thermally couples said chimney to said electronic component.

11. The electronic module as set forth in claim 10, further comprising:
a cover assembly defining a space in which said electronic component is located, wherein said chimney, heat channel, and heat output block of said thermal pathway are defined by a heat sink cover portion of said cover assembly.

12. The electronic module as set forth in claim 11, wherein said chimney, heat channel, and heat output block of said thermal pathway are defined as a one-piece metallic construction by said heat sink cover portion.

13. The electronic module as set forth in claim 12, wherein said heat channel is defined by at least part of an outer wall of said heat sink cover portion.

14. An electronic module installation comprising:
a chassis comprising a metallic heat input region;
an electronic module removably connected to the chassis, said electronic module comprising an electronic component;
an uninterrupted thermal pathway that thermally connects said electronic component to said heat input region of said chassis, said thermal pathway comprising:
a metallic chimney;
a metallic heat channel thermally connected to the chimney;
a metallic heat output block thermally connected to the heat channel;
first and second electrically insulative non-metallic layers that respectively thermally couple said chimney to said electronic component and said heat output block to said chassis heat input region.

15. The electronic module installation as set forth in claim 14, wherein said chimney, heat channel, and heat output block comprise a one-piece metallic construction.

16. The electronic module installation as set forth in claim 15, wherein said one-piece metallic construction defines a heat sink cover portion of a cover assembly that defines a space in which said electronic component is located.

17. The electronic module installation as set forth in claim 16, wherein said heat channel comprises at least part of an outer wall of said heat sink cover portion, said heat output block comprises a projecting tail of said heat sink cover portion, and said chimney projects from an inner surface of said outer wall.

18. The electronic module as set forth in claim 17, wherein said chimney comprises a plurality of spaced-apart fins that define a plurality of air flow channels.

19. The electronic module as set forth in claim 18, wherein said chimney comprises a base that extends between and interconnects said spaced-part fins.

* * * * *